Nov. 2, 1965 R. W. KORB 3,215,574
METHOD OF MAKING THIN FLEXIBLE PLASTIC-SEALED
PRINTED CIRCUITS
Filed March 25, 1963

Robert W. Korb,
INVENTOR.
BY.
Noel B. Hammond
AGENT.

United States Patent Office 3,215,574
Patented Nov. 2, 1965

3,215,574

METHOD OF MAKING THIN FLEXIBLE PLASTIC-SEALED PRINTED CIRCUITS

Robert W. Korb, Los Angeles, Calif., assignor to Hughes Aircraft Company, Culver City, Calif., a corporation of Delaware Filed Mar. 25, 1963, Ser. No. 267,664
5 Claims. (Cl. 156—3)

The present invention relates to circuits having printed or etched electrical conductors sealed between thin layers of flexible plastic material and, more particularly, to a methode of making plastic selaed printed circuits in which the physical dimensions are maintained constant during manufacture without including an integral layer of glass cloth in the finished product.

In the making of thin, flexible plastic-sealed printed circuits such as parallel conductor flexible ribbon cable or individually designed flexible wiring harnesses, it is important that the physical dimensions be maintained constant. The connection terminals of flexible plastic-sealed printed circuits usually must be separated by precise physical dimensions in order to fit the terminals of the external electrical device to which the circuit is to be connected. In addition, the electrical characteristics of the plastic-sealed printed circuit may be in part determined by the distance between conductors.

Errors in the physical dimensions of these plastic-sealed printed circuits occur because the electrical conductors are sealed between layers of plastic material by means of heat and pressure. The plastic material is softened and to some extent liquefied during manufacture. The result is a tendency for the conductors to "swim" or move relative to each other in the softened or partially liquefied plastic material. In addition to the dimensional instability, the finished article is often severely distorted, having a waviness which prevents it from lying flat.

In addition, a certain amount of shrinkage usually occurs in the process of manufacture. For example, when a sheet of plastic material is laminated to a sheet of metal such as copper using heat and pressure, the difference between coefficients of expansion of the two materials causes lateral stresses to occur in the plastic material as the materials cool to room temperature. Subsequently, the copper is etched in a pattern to form electrical conductors. Because the copper between conductors has been removed, the plastic material shrinks to relieve the lateral stresses, causing the dimension between adjacent conductors to decrease. A second sheet of plastic material is then sealed over the exposed conductors using heat and pressure. As the first sheet of plastic material is being raised to the temperature at which sealing occurs, it shrinks further to relieve remaining lateral stresses. Shrinkage is especially severe when plastic materials having a high softening temperature are used because of the greater stresses that occur in the plastic when the materials are cooled to room temperature.

To counteract shrinkage, the shrinkage factor, which may be approximately 5%, is determined empirically and the pattern for etching the copper is drawn to an expanded scale which compensates as exactly as possible for the anticipated shrinkage. The shrinkage factor must be separately determined for each different etched circuit pattern. All parameters such as thickness of layers, sealing temperatures, etc., must be precisely maintained during manufacture to avoid variation in the shrinkage factor.

Another technique which is sometimes employed to achieve dimensional stability in thin, flexible plastic-sealed printed circuits is to utilize at least one permanent integral layer of a fibrous material such as glass cloth in the laminated circuit. Actually, two layers of glass cloth are usually employed, disposed symmetrically on each side of the layer of copper to counteract curling of the circuit which occurs due to unequal stresses when only one layer of glass cloth is used. The glass cloth provides dimensional stability because it shrinks very little itself and restrains the plastic material from shrinking due to the close bond between the plastic material and the glass cloth. In this manner, the shrinkage factor may be reduced to 1% or less. The disadvantage of a plastic-sealed printed circuit including one or more permanent integral layers of glass cloth is the increased thickness and stiffness due to the glass cloth which causes the circuit to be more bulky and less flexible. In addition, the humidity resistance and electrical properties are deleteriously affected by the glass cloth; and the "flex-life," or number of flexings which the circuit will withstand without physical deterioration is reduced.

Accordingly, it is an object of the present invention to provide a method of making plastic-sealed printed circuits having good dimensional stability during manufacture without including a permanent integral layer of glass cloth in the finished product.

In accordance with this and other objects of the invention, thin, flexible plastic-sealed printed circuits are made by causing at least one layer of heat-resistant, dimensionally stable fibrous material such as glass cloth to temporarily adhere to a layer of plastic material during manufacture of the circuit and thereafter removing the layer of fibrous material to form the finished product. In this manner, the fibrous material stabilizes the dimensions of the plastic material during manufacture but does not become a permanent integral part of the plastic-sealed printed circuit. Temporary adherence is effected by utilizing a fibrous material that is impregnated with nonliquefiable plastic fluorocarbon material, and sealing it to a layer of liquefiable plastic fluorocarbon material, using a temperature, pressure and sealing time such that the impregnated fibrous material adheres intimately to the layer of liquefiable plastic material and yet can be peeled away therefrom. As a specific example, glass cloth impregnated with a non-liquefiable plastic fluorocarbon material such as a resinous polymer of polytetrafluoroethylene, is sealed to a sheet of liquefiable plastic fluorocarbon material such as a resinous copolymer of tetrafluoroethylene and hexafluoropropene at a temperature in the range of 550°–600° F. (Fahrenheit), a pressure in the range of 15–30 p.s.i. (pounds per square inch) and for a length of time on the order of 20 seconds. After bonding a thin layer of copper to the copolymer of tetrafluoroethylene and hexafluoropropene, etching the copper to produce a conductive circuit, a covering layer of a copolymer of tetrafluoroethylene and hexafluoropropene is sealed over the exposed circuit. A laminated cover may be used which includes a second layer of impregnated glass cloth to provide additional dimensional stability and to prevent curling of the plastic-sealed circuit. The last step in the process is to remove the glass cloth by peeling it away to produce the finished product.

The following specification and the accompanying drawing describe and illustrate an exemplary method of practicing the present invention. Consideration of the specification and the drawing will provide an understanding of the invention, including the novel features and objects thereof. Like reference characters denote like parts throughout the figures of the drawing.

Figure 1:
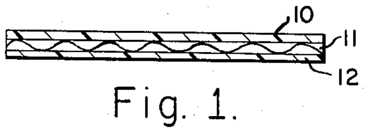
FIG. 1 is a cross-sectional view of a laminated article appearing at a preliminary step in the process of making a thin, flexible plastic-sealed printed circuit in accordance with the invention.

Referring now to FIG. 1 of the drawing, there is shown a laminated article appearing at a preliminary step in the process of manufacturing a thin, flexible plastic-sealed printed circuit in accordance with the invention. In the present example, the circuit being manufactured is an elongated parallel conductor flexible ribbon cable. FIG. 1 is a cross-sectional view transverse to the longitudinal axis of the article, the longitudinal axis extending in a direction which may be described as going into the drawing. A first layer of a liquefiable plastic fluorocarbon material 10, such as a resinous copolymer of tetrafluoroethylene and hexafluoropropene, is laminated to one side of a layer of heat-resistant fibrous material such as glass cloth 11 which is impregnated with a non-liquefiable plastic fluorocarbon material, such as a resinous polymer of polytetrafluoroethylene. A second layer of liquefiable plastic fluorocarbon material 12, which may be the same as the first layer of plastic material 10, may be laminated to the other side of the layer of glass cloth 11.

The drawing is for purposes of illustration only and the dimensions are enlarged and exaggerated for purposes of clarity. The layers shown in the figures are actually quite thin. For example, the two layers of plastic material 10 and 12 may be on the order of .005–.020 inch in thickness and the layer of glass cloth 11 may be on the order of .003–.006 inch.

The resinous copolymer of tetrafluoroethylene and hexafluoropropene used as the two layers of plastic fluorocarbon material 10 and 12 may be the material sold under the name FEP Teflon, a trademark of E. I. du Pont de Nemours & Co. The resinous polymer of polytetrafluoroethylene with which the layer of glass cloth 11 is impregnated may be the material sold under the name TFE Teflon, also a trademark of E. I. du Pont de Nemours & Co.

The layer of glass cloth 11 may be impregnated with polytetrafluoroethylene by any suitable method. One such method is described in U.S. Patent No. 2,731,068, issued January 17, 1956, to Kurt F. Richards. A suitable commercially available impregnated glass cloth may be used, if desired. Glass cloth impregnated with TFE Teflon and sold under the name Armalon (a trademark of E. I. du Pont de Nemours & Co.) has been found to be satisfactory.

The resinous polymer of polytetrafluoroethylene with which the glass cloth 11 is impregnated will not melt or liquefy, although it will soften when heated above a predetermined temperature. The layers of the copolymer of tetrafluoroethylene and hexafluoropropene material 10 and 12, however, will melt or liquefy when heated to a suitable temperature. These two different types of plastic fluorocarbon material may be permanenty bonded together between heated platens of a press by using a sufficiently high temperature and pressure. When using layers of FEP Teflon material 10 and 12, with TFE Teflon impregnated glass cloth 11, for example, a permanent bond is formed when the materials are heated to approximately 680°–700° F. at a pressure of 25–50 p.s.i. The exact pressure depends somewhat on the time the materials are in the press. The layers are then permanently joined and cannot thereafter be separated It has been found that when the layers are bonded at a lower temperature, they will adhere intimately and yet can be separated by peeling one away from the other. The temperature must be high enough to cause softening of the material which impregnates the glass cloth 11 and yet low enough to prevent the formation of a permanent bond. When using FEP Teflon with TFE Teflon impregnated glass cloth, the temperature to produce a temporary bond is found to be approximately 550°–600° F. The exact temperature to be used depends somewhat on the thickness of the layers, the pressure and the bonding time. For example, when bonding layers of FEP Teflon material 10 and 12 having a thickness of .005 inch to TFE Teflon impregnated glass cloth 11 having a thickness of .003 inch, a temperature of 550° F. and a pressure of 20 p.s.i. has been found satisfactory. The bonding time required may be several minutes. However, when bonding thicker layers of plastic material 10 and 12, for example, .010–.020 inch, using a bonding time of shorter duration, as for example 20 seconds, a temperature of 580°–600° F. is found to be more satisfactory.

The layers of liquefiable plastic fluorocarbon material 10 and 12 may be made of other materials, although a resinous copolymer of tetrafluoroethylene and hexafluoropropene is preferred. Such other materials may be polyethylene, polyvinyl chloride, other vinyls or polytrifluoromonochloroethylene sold under the name Kel-F (a trademark of Minnesota Mining and Manufacturing Co.). If these materials are used instead of a resinous copolymer of tetrafluoroethylene and hexafluoropropene, it may be necessary to modify the temperature, pressure and bonding time to achieve the desired result in accordance with the practice of the present invention. Although there may be other nonliquefiable plastic fluorocarbon materials that may be used to impregnate the glass cloth 11, a resinous polymer of polytetrafluoroethylene is preferred.

As used herein, the term "plastic" means a synthetic organic material whose principal component is a resinous organic compound. The term "liquefiable plastic material" is intended to apply to all those plastic materials which tend to flow at given temperatures. The term "non-liquefiable plastic material" means those plastic materials which do not go through a liquid state before being substantially decomposed under the influence of heat. The term "ethylene" includes all those plastic materials retaining the ethylene radical substantially intact and the term "vinyl" includes all those plastic materials in which at least one of the hydrogens is displaced by an electro-negative element or radical.

Figure 2:
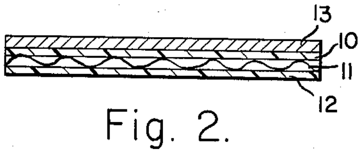
FIG. 2 is a cross-sectional view of the laminated article of FIG. 1 showing an additional layer added thereto.

The laminated article shown in FIG. 1 forms the base for making the printed circuit. As shown in FIG. 2, a layer of copper 13 is bonded to the base. The layer of copper 13 may be 2 ounce copper sheet which has a thickness of .0028–.0030 inch. The layer of copper 13 is first treated to produce an oxide coating thereon which enables the surface of the copper 13 to be bonded to the liquefiable plastic fluorocarbon material 10. The oxide coating may be formed by any suitable method and may be brown or black in color. One suitable method for producing a black cupric oxide coating is described in U.S. Patent No. 2,364,993, issued December 12, 1944, to Walter R. Meyer. After formation of the oxide coating, the layer of copper 13 is bonded to the layer of liquefiable plastic fluorocarbon material 10, using the same temperature, pressure and bonding time as was used in laminating the base.

Figure 3:
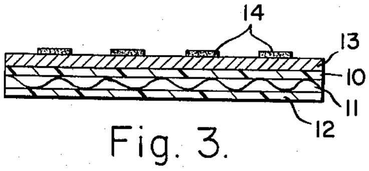
FIG. 3 is a cross-sectional view of the laminated article of FIG. 2 showing a pattern of etch-resistant material applied thereto.

Referring now to FIG. 3, a pattern of etch-resistant material 14 is applied to the copper 13. The etch-resistant material 14 may be applied in any of several different ways, as by silk screening, printing, or a photographic exposure technique, as is well known. See, for example, the book entitled "The Technology of Printed Circuits,"

by P. Eisler, London, Heywood & Co., Ltd., 1959. The etch-resistant material 14 is disposed on those areas of the copper 13 in which it is desired to have electrical conductors in the finished product. In the present example, a parallel conductor flexible ribbon cable is being produced and, consequently, the etch-resistant material 14 is applied in elongated parallel strips, which are shown in cross section in the drawing.

Figure 4:
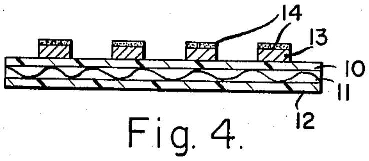
FIG. 4 is a cross-sectional view of the laminated article of FIG. 3 after portions not protected by the etch-resistant material have been etched away.
Figure 5:
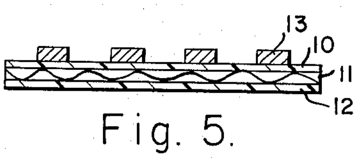
FIG. 5 is a cross-sectional view of the laminated article of FIG. 4 after the etch-resistant material has been removed.

Referring now to FIG. 4, the laminate is exposed to an etching solution, which may be ferric chloride for example, to remove areas of the copper 13 not covered by the etch-resistant material 14. After etching, the etch-resistant material 14 is removed from the remaining strips of copper 13 by a suitable solvent to leave the parallel strips of copper 13 exposed on top of the laminated base, as shown in FIG. 5.

Figure 6:
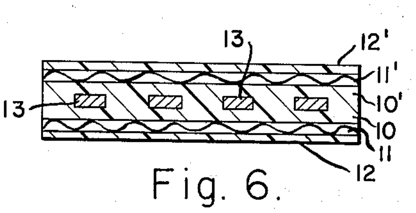
FIG. 6 is a cross-sectional view of the laminated article of FIG. 5 after additional layers have been added thereto.

A laminated cover, identical to the laminated base, is bonded to the base over the exposed pattern of copper 13. As shown in FIG. 6, the laminated cover comprises a first layer of liquefiable plastic fluorocarbon material 10′; a layer of glass cloth 11′ impregnated with a non-liquefiable plastic fluorocarbon material, and may include a second layer of liquefiable plastic fluorocarbon material 12. The plastic materials used in the laminated cover are identical to those used in the corresponding layers of the laminated base. The layers comprising the laminated cover are first bonded together, and then the cover is bonded to the base over the exposed copper 13. The temperature, pressure and bonding time used in laminating the cover and bonding the cover to the base may be identical to that used in laminating the base and in bonding the copper 13 to the base. However, in bonding the laminated cover to the laminated base, the pressure may be reduced, if desired, to 5 pounds per square inch, for example, inasmuch as greater pressure is not necessary to cause the two layers 10 and 10′ to fuse together and to the copper 13. Furthermore, excessive pressure at this stage tends to cause the circuit pattern to move or "swim."

Figure 7:
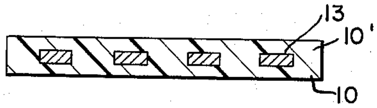
FIG. 7 is a cross-sectional view of a completed thin, flexible plastic-sealed printed circuit made by the process of the present invention.

The two inner layers of plastic fluorocarbon material 10 and 10′ are permanently fused together and cannot be separated. However, the outer two layers on each side thereof, namely, the glass cloth 11 and 11′ and the outer layers of liquefiable plastic fluorocarbon material 12 and 12′, adhere intimately thereto but do not form a permanent integral part of the finished product. As the last step in the process, the layers of glass cloth 11 and 11′ are peeled away from the inner layers of plastic material 10 and 10′ to leave the finished article as shown in FIG. 7. The peeling may be done with the fingers after the layers are slightly separated with the fingernails or the point of a knife.

The outer layers of liquefiable plastic fluorocarbon material 12 and 12′ remain with the glass cloth 11 and 11′ and are discarded therewith. These outer layers of material 12 and 12′ can be dispensed with in the practice of the present invention, if desired, inasmuch as they serve only to balance the laminated construction, making the laminated article easier to handle during manufacture. Without the outer layers of material 12 and 12′, the laminated article tends to curl toward one side, requiring additional handling to flatten it out and center it in the press. The second layer of glass cloth 11′ may also be dispensed with, if desired, providing that the resultant curl due to the lack of symmetry can be tolerated. The first layer of glass cloth 11 is sufficient to maintain dimensional stability during manufacture although the second layer of glass cloth 11′ does provide additional dimensional stability. However, a single cover layer of liquefiable plastic fluorocarbon material 12′ may be bonded to the laminated base over the pattern of copper 13.

Thus, there has been described a process for making thin, flexible plastic-sealed printed circuits without incorporating a permanent integral layer of glass cloth in the finished product. The temporary adherence of fibrous material to the article stabilizes the dimensions of the plastic material during manufacture and also eliminates distortion such as waviness, thereby permitting the finished article to lie flat. The process is economical despite the cost of the material which is discarded at the conclusion of the process because if the article is made of two layers of liquefiable plastic material without using glass cloth, a large number of finished articles must be discarded due to their not being within the dimensional tolerance. By practicing the present invention, the dimensions of the articles are sufficiently stabilized during manufacture that few, if any, finished articles must be discarded because of not being within the dimensional tolerance. A tolerance of 1% has been attained by use of the present invention. The finished article is also much thinner and more flexible than similar articles which incorporate a permanent integral layer of glass cloth.

While several variations in the practice of the invention have been shown and described, other variations may be made and it is intended that the foregoing disclosure shall be considered only as illustrative of the principles of the invention and not construed in a limiting sense.

What is claimed is:

1. A method of making thin, flexible plastic-sealed printed circuits comprising:

(a) bonding a layer of resinous copolymer of tetrafluoroethylene and hexafluoropropene to a layer of glass cloth impregnated with a resinous polymer of of polytetrafluoroethylene at a temperature of 550° Fahrenheit and a pressure of 20 pounds per square inch to produce a dimensionally stable laminated base;

(b) bonding a layer of oxide-coated copper to said layer of resinous copolymer of tetrafluoroethylene and hexafluoropropene at a temperature of 550° Fahrenheit and a pressure of 20 pounds per square inch;

(c) etching said copper to form a pattern of electrical conductors;

(d) fusing a cover layer of a resinous copolymer of tetrafluoroethylene and hexafluoropropene to said laminated base over said pattern of electrical conductors at a temperature of 550° Fahrenheit and a pressure of 5 pounds per square inch;

(e) and peeling said layer of glass cloth away from said fused layers of a resinous copolymer of tetrafluoroethylene and hexafluoropropene having said pattern of electrical conductors sealed therebetween.

2. A method of making thin, flexible plastic-sealed printed circuits comprising:

(a) bonding a layer of a resinous copolymer of tetrafluoroethylene and hexafluoropropene to a layer of glass cloth impregnated with a resinous polymer of polytetrafluoroethylene at a temperature of 580°–600° Fahrenheit, a pressure of 15–30 pounds per square inch, for a length of time of 20 seconds, to produce a dimensionally stable laminated base;

(b) bonding a layer of oxide-coated copper to said layer of resinous copolymer of tetrafluoroethylene and hexafluoropropene at a temperature of 580°–600° Fahrenheit, a pressure of 15–30 pounds per square inch, for a length of time of 20 seconds;

(c) etching said copper to form a pattern of electrical conductors;

(d) fusing a cover layer of a resinous copolymer of tetrafluoroethylene and hexafluoropropene to said laminated base over said pattern of electrical conductors at a temperature of 580°–600° Fahrenheit, a pressure of 5 pounds per square inch, for a length of time of 20 seconds;

(e) and peeling said layer of glass cloth away from said fused layers of a resinous copolymer of tetrafluoroethylene and hexafluoropropene having said pattern of electrical conductors sealed therebetween.

3. A method of making thin, flexible plastic-sealed printed circuits comprising:

(a) bonding a layer of resinous copolymer of tetrafluoroethylene and hexafluoropropene to a layer of glass cloth impregnated with a resinous polymer of polytetrafluoroethylene at a temperature of 550°–600° Fahrenheit, a pressure of 15–30 pounds per square inch, for a length of time of 20 seconds, to produce a dimensionally stable laminated base;

(b) bonding a layer of oxide-coated copper to said layer of a resinous copolymer of tetrafluoroethylene and hexafluoropropene at a temperature of 550°–600° Fahrenheit, a pressure of 15–30 pounds per square inch, for a length of time of 20 seconds.

(c) etching said copper to form a pattern of electrical conductors;

(d) fusing a cover layer of a resinous copolymer of tetrafluoroethylene and hexafluoropropene to said laminated base over said pattern of electrical conductors at a temperature of 550°–600° Fahrenheit, a pressure of 5 pounds per square inch, for a length of time of 20 seconds;

(e) and peeling said layer of glass cloth away from said fused layers of a resinous copolymer of tetrafluoroethylene and hexafluoropropene having said pattern of electrical conductors sealed therebtewen.

4. A method of making thin, flexible plastic-sealed printed circuits comprising:

(a) bonding a layer of a resinous copolymer of tetrafluoroethylene and hexafluoropropene to a layer of glass cloth impregnated with a resinous polymer of polytetrafluoroethylene at a temperature of 550°–600° Fahrenheit, a pressure of 15–30 pounds per square inch, for a length of time of 20 seconds, to produce a dimensionally stable laminated base;

(b) bonding a layer of oxide-coated copper to said layer of a resinous copolymer of tetrafluoroethylene and hexafluoropropene at a temperature of 550°–600° Fahrenheit, a pressure of 15–30 pounds per square inch, for a length of time of 20 seconds;

(c) etching said copper to form a pattern of electrical conductors;

(d) bonding a layer of a resinous copolymer of tetrafluoroethylene and hexafluoropropene to a layer of glass cloth impregnated with a resinous polymer of polytetrafluoroethylene at a temperature of 550°–600° Fahrenheit, a pressure of 15–30 pounds per square inch, for a length of time of 20 seconds, to produce a dimensionally stable laminated cover;

(e) bonding said laminated cover to said laminated base over said pattern of electrical conductors at a temperature of 550°–600° Fahrenheit, a pressure of 5 pounds per square inch, for a length of time of 20 seconds with said layers of glass cloth on the outside to fuse the layers of a resinous copolymer of tetrafluoroethylene and hexafluoropropene to each other and to said pattern of electrical conductors;

(f) and peeling said layers of glass cloth away from said fused layers of a resinous copolymer of tetrafluoroethylene and hexafluoropropene having said pattern of electrical conductors sealed therebetween.

5. A method of making thin, flexible plastic-sealed printed circuits comprising:

(a) bonding a layer of resinous copolymer of tetrafluoroethylene and hexafluoropropene to each side of a layer of glass cloth impregnated with a resinous polymer of polytetrafluoroethylene at a temperature of 550°–600° Fahrenheit, a pressure of 15–30 pounds per square inch, for a length of time of 20 seconds, to produce a dimensionally stable laminated base;

(b) bonding a layer of cupric oxide-coated copper to one side of said laminated base at a temperature of 550°–600° Fahrenheit, a pressure of 15–30 pounds per square inch, for a length of time of 20 seconds;

(c) coating said copper with etch-resistant material in a predetermined pattern corresponding to a desired pattern of electrical conductors;

(d) etching said copper with ferric chloride to remove the copper between the areas coated with etch resistant material to form the desired pattern of electrical conductors;

(e) removing the etch-resistant material from the pattern of electrical conductors with a suitable solvent;

(f) bonding a layer of a resinous copolymer of tetrafluoroethylene and hexafluoropropene to each side of a layer of glass cloth impregnated with a resinous polymer of polytetrafluoroethylene at a temperature of 550°–600° Fahrenheit, a pressure of 15–30 pounds per square inch, for a length of time of 20 seconds, to produce a dimensionally stable laminated cover;

(g) bonding said laminated cover to said laminated base over said pattern of electrical conductors at a temperature of 550°–600° Fahrenheit, a pressure of 5 pounds per square inch, for a length of time of 20 seconds to fuse the inner layers of a resinous copolymer of tetrafluoroethylene and hexafluoropropene to each other and to said pattern of electrical conductors;

(h) and peeling said layers of glass cloth away from the fused inner layers of a resinous copolymer of tetrafluoroethylene and hexafluoropropene having said pattern of electrical conductors sealed therebetween.

References Cited by the Examiner

UNITED STATES PATENTS

| | | | |
|---|---|---|---|
| 3,086,071 | 4/63 | Preston. | |
| 3,135,823 | 6/64 | Pritikin | 156—3 XR |

ALEXANDER WYMAN, *Primary Examiner.*

JACOB STEINBERG, *Examiner.*